(12) United States Patent
You et al.

(10) Patent No.: US 8,084,359 B2
(45) Date of Patent: Dec. 27, 2011

(54) SEMICONDUCTOR PACKAGE AND METHODS OF MANUFACTURING THE SAME

(75) Inventors: Se-Ho You, Seoul (KR); Ki-Won Choi, Gyeonggi-do (KR); Eun-Seok Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/656,680

(22) Filed: Feb. 12, 2010

(65) Prior Publication Data

US 2010/0167423 A1 Jul. 1, 2010

Related U.S. Application Data

(62) Division of application No. 11/877,520, filed on Oct. 23, 2007, now abandoned.

(30) Foreign Application Priority Data

Oct. 31, 2006 (KR) .............................. 2006-105972

(51) Int. Cl.
*H01L 21/4763* (2006.01)
(52) U.S. Cl. .................... 438/649; 257/758; 257/774
(58) Field of Classification Search .............. 257/758, 257/774; 438/649
See application file for complete search history.

(56) References Cited

U.S. PATENT DOCUMENTS

| 6,717,068 | B2 | 4/2004 | Motonishi et al. |
| 6,841,875 | B2 | 1/2005 | Ohsumi |
| 2004/0238929 | A1* | 12/2004 | Anzai et al. ............ 257/678 |
| 2005/0070050 | A1 | 3/2005 | Murakami |
| 2005/0087859 | A1* | 4/2005 | Chao et al. ............. 257/700 |
| 2005/0277283 | A1* | 12/2005 | Lin et al. ................ 438/618 |

FOREIGN PATENT DOCUMENTS

| JP | 2005-038932 | 2/2005 |
| KR | 10-0596797 | 6/2006 |

OTHER PUBLICATIONS

U.S. Office Action for U.S. Appl. No. 11/877,520 dated Apr. 30, 2009.
U.S. Office Action for U.S. Appl. No. 11/877,520 dated Nov. 12, 2009.

* cited by examiner

*Primary Examiner* — Steven Loke
*Assistant Examiner* — Kimberly M Thomas
(74) *Attorney, Agent, or Firm* — Harness, Dickey & Pierce, P.L.C.

(57) ABSTRACT

A semiconductor package includes a semiconductor chip having first and second pads, a first insulation layer pattern formed on the semiconductor chip and having first and second openings that expose the first and the second pads, respectively, a first conductive layer pattern elongated along the first insulation layer pattern from the first pad, a first external terminal formed on the first conductive layer pattern, a second insulation layer pattern formed on the first conductive layer pattern and the first insulation layer pattern to expose the first external terminal and having a third opening in communication with the second opening, a second conductive layer pattern elongated along the second insulation layer pattern from the second pad, and a second external terminal formed on the second conductive layer pattern.

13 Claims, 8 Drawing Sheets

SEMICONDUCTOR PACKAGE AND METHODS OF MANUFACTURING THE SAME

CROSS-REFERENCE TO RELATED APPLICATIONS

This application is a divisional of U.S. application Ser. No. 11/877,520, filed Oct. 23, 2007, now abandoned which claims priority under 35 U.S.C. §119 to Korean Patent Application No. 2006-105972, filed on Oct. 31, 2006 in the Korean Intellectual Property Office, the contents of each of which are incorporated herein by reference in their entirety.

BACKGROUND

1. Technical Field

Example embodiments of the present invention relate to a semiconductor package and methods of manufacturing the same. More particularly, example embodiments of the present invention relate to a wafer-level package and methods of manufacturing the same.

2. Description of the Related Art

Generally, a plurality of semiconductor chips are formed by performing various semiconductor processes on a semiconductor substrate. To mount each of the semiconductor chips on a mother-board, a packaging process is performed on the semiconductor substrate.

According to a conventional packaging process, a semiconductor substrate is cut along a scribe lane to separate the semiconductor substrate into a plurality of semiconductor chips. After attaching the semiconductor chip on a printed substrate, bonding pads of the semiconductor chip are electrically connected to the printed substrate using a conductive wire, or the like. A mold is formed on the printed substrate to surround the semiconductor substrate with the mold, and external terminals such as solder balls are mounted on the printed substrate.

However, because the conventional packaging process is individually performed on each of the semiconductor chips, the efficiency of the conventional packaging process may be very low.

To solve the above-mentioned problems, a wafer-level packaging process has recently been suggested in which a semiconductor substrate is cut after a packaging process is carried out on an entire surface of the semiconductor substrate.

In the conventional wafer-level package, external terminals are arranged on substantially the same plane. That is, the external terminals have a single-layered structure. The external terminals have the single-layered structure, because pads of a board on which the wafer-level packages are mounted are on substantially the same plane. In other words, since the pads in electrical contact with the external terminals are arranged on substantially the same plane, the external terminals may have a single-layered structure.

However, the external terminals of the wafer-level package are inserted into the board in recently preferred technologies in order to increase the bonding strength between the wafer-level package and the board. Thus, slots for receiving the external terminals are formed at a surface portion of the boards. The pads of the board are arranged around the slot.

However, because the conventional wafer-level package has the single-layered external terminals, the conventional wafer-level package may have a large size in order to avoid an electrical short between the external terminals. Specifically, to ensure reliable electrical connections between the external terminals and the pads of the board, the board is required to have a relatively large size. That is, since the pads are arranged around the slots to avoid an electrical short between the pads, the size of the board, on which each of the pads corresponding to the external terminals is arranged, may be large. The present invention addresses these and other disadvantages of the conventional art.

SUMMARY

Example embodiments of the present invention provide a semiconductor package having a small size that is capable of preventing an electrical short between external terminals. Example embodiments of the present invention also provide a method of manufacturing the above-mentioned semiconductor package.

According to one aspect of the present invention, a semiconductor package includes a semiconductor chip, a first insulation layer pattern, a first conductive layer pattern, a first external terminal, a second insulation layer pattern, a second conductive layer pattern, and a second external terminal. The semiconductor chip has first and second pads. The first insulation layer pattern is formed on the semiconductor chip. Further, the first insulation layer pattern has first and second openings that expose the first and the second pads, respectively. The first conductive layer pattern is elongated along the first insulation layer pattern from the first pad. The first external terminal is formed on the first conductive layer pattern. The second insulation layer pattern is formed on the first conductive layer pattern and the first insulation layer pattern to expose the first external terminal. Further, the second insulation layer pattern has a third opening in communication with the second opening. The second conductive layer pattern is elongated along the second insulation layer pattern from the second pad. The second external terminal is formed on the second conductive layer pattern.

According to an aspect of the present invention, a semiconductor package includes a semiconductor chip, a first insulation layer pattern, a first conductive layer pattern, a first external terminal, a second insulation layer pattern, a second conductive layer pattern, and a second external terminal. The semiconductor chip has first and second pads. The first insulation layer pattern is formed on the semiconductor chip. Further, the first insulation layer pattern has first and second openings that expose the first and the second pads, respectively. The first conductive layer pattern is elongated along the first insulation layer pattern from the first pad. The first external terminal is formed on the first conductive layer pattern. The second insulation layer pattern is formed on the first conductive layer pattern and the first insulation layer pattern to expose the first external terminal. Further, the second insulation layer pattern has a third opening in communication with the second opening. The second conductive layer pattern is elongated along the second insulation layer pattern from the second pad. The second external terminal is formed on the second conductive layer pattern.

According to one example embodiment, the second external terminal may be placed on a position higher than that on which the first external terminal is positioned. Further, the second insulation layer pattern may have a protrusion higher than a surface of the first external terminal, and the second external terminal may be formed on the protrusion.

According to another aspect of the present invention, there is provided a method of manufacturing a semiconductor package. In the method of manufacturing the semiconductor package, a first insulation layer pattern having first and second openings that expose first and second pads of a semiconductor chip is formed on the semiconductor chip. A first conductive layer pattern is elongated along the first insulation layer pattern from the first pad. A first external terminal is then formed on the first conductive layer pattern. A second insulation layer pattern having a third opening in communication with the second opening is formed on the first conductive layer pattern and the first insulation layer pattern to expose the first external terminal. A second conductive layer pattern is elongated along the second insulation pattern from the second pad. A second external terminal is then formed on the second conductive layer pattern.

According to one example embodiment, forming the first insulation layer pattern may include forming a first insulation layer on the semiconductor substrate, and etching the first insulation layer to form the first insulation layer pattern having the first and the second openings.

Further, forming the first conductive layer pattern may include forming a first conductive layer on the first insulation layer pattern to fill up the first opening, and etching the first conductive layer to form the first conductive layer pattern.

Furthermore, forming the second insulation layer pattern may include forming a second insulation layer on the first conductive layer pattern and the first insulation layer pattern to cover the first external terminal, partially removing a surface of the second insulation layer to form a second insulation structure having a protrusion higher than the first external terminal, and etching the second insulation structure to form the second insulation layer pattern having the third opening.

Moreover, forming the second conductive layer pattern may include forming a second conductive layer on the second insulation layer pattern to cover the second and the third openings, and etching the second conductive layer to form the second conductive layer pattern.

According to some embodiments, the semiconductor package is manufactured at a wafer level and the method further comprises separating the semiconductor package from other semiconductor packages in a wafer after forming the second external terminal.

According to another aspect of the present invention, a semiconductor package includes a semiconductor chip, a first insulation layer pattern, a first conductive layer pattern, a ground terminal, a second insulation layer pattern, a second conductive layer pattern, and a signal terminal. The semiconductor chip has a ground pad and a signal pad. The first insulation layer pattern is formed on the semiconductor chip. Further, the first insulation layer pattern has first and second openings that expose the ground pad and the signal pad. The first conductive layer pattern is elongated along the first insulation layer pattern from the ground pad. The ground terminal is formed on the first conductive layer pattern. The second insulation pattern is formed on the first conductive layer pattern and the first insulation layer pattern to partially expose the ground terminal. Further, the second insulation layer pattern has a third opening in communication with the second opening. The second conductive layer pattern is elongated along the second insulation layer pattern from the signal pad. The signal terminal is formed on the second conductive layer pattern.

According to one example embodiment, the signal terminal may be located on a position higher than that on which the ground terminal is positioned. Further, the ground terminal may have a width wider than that of the signal terminal.

According to the present invention, the terminals have a stacked structure so that the semiconductor package may have a relatively small size while preventing an electrical short between the terminals. Further, because pads of a board connected to the terminals may be alternately arranged around slots of the board, a size of the board may be reduced.

BRIEF DESCRIPTION OF THE DRAWINGS

The above and other features and advantages of the present invention will become readily apparent by reference to the following detailed description when considered in conjunction with the accompanying drawings, wherein.

DETAILED DESCRIPTION OF EXAMPLE EMBODIMENTS

Figure 1:
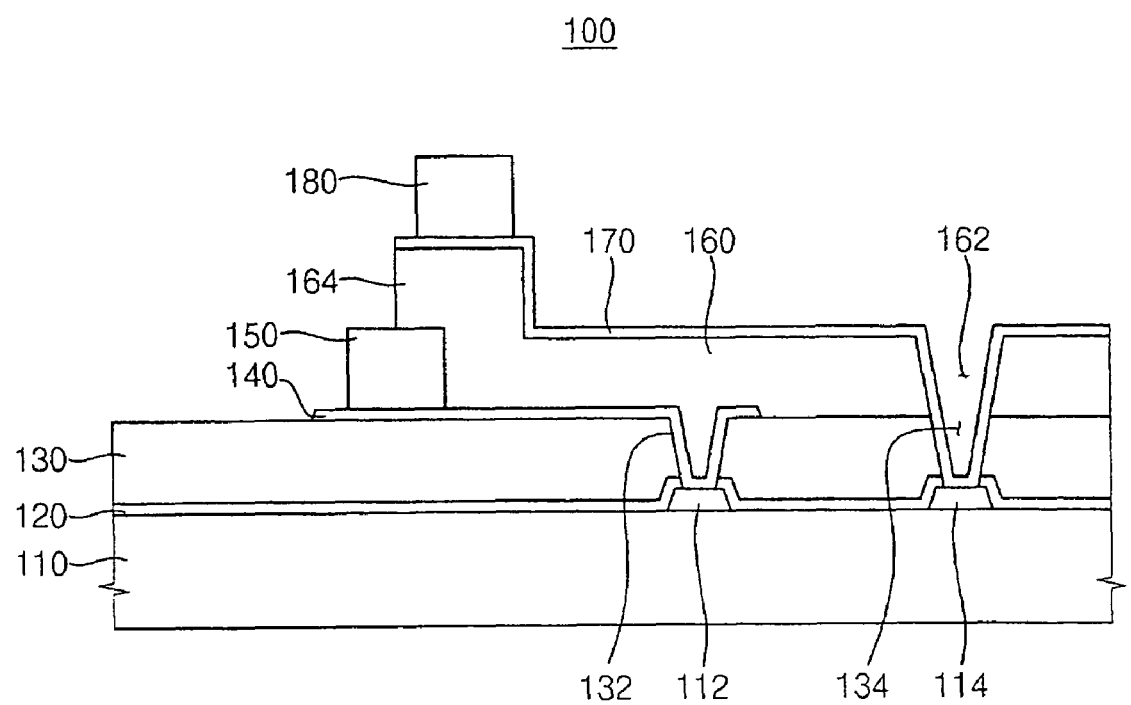
FIG. 1 is a cross-sectional view illustrating a semiconductor package in accordance with a first example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example Embodiment 1

FIG. 1 is a cross-sectional view illustrating a semiconductor package in accordance with a first example embodiment of the present invention.

Referring to FIG. 1, a semiconductor package 100 in accordance with the example embodiment may include a semiconductor chip 110, a first insulation layer pattern 130, a first conductive layer pattern 140, a first external terminal 150, a second insulation layer pattern 160, a second conductive layer pattern 170 and a second external terminal 180.

First and second pads 112 and 114 are formed on the surface of the semiconductor chip 110. A passivation layer 120 is formed on the surface of the semiconductor chip 110. The first and the second pads 112 and 114 are exposed through openings formed through the passivation layer 120.

The first insulation layer pattern 130 is formed on the passivation layer 120. The first insulation layer pattern 130 has a first opening 132 exposing the first pad 112 and a second opening 134 exposing the second pad 114. In the example embodiment of the present invention, examples of the first insulation layer pattern 130 may include a silicon oxide layer, a silicon nitride layer, and so on.

The first conductive layer pattern 140 is formed on the first insulation layer pattern 130. The first conductive layer pattern 140 is formed along the inner surface of the first opening 132 electrically connected to the first pad 112. That is, the first conductive layer pattern 140 has a first end electrically connected to the first pad 112, and a second end elongated along the surface of the first insulation layer pattern 130 from the first end. In this example embodiment, an example of the first conductive layer pattern 140 may include a metal such as aluminum.

The first external terminal 150 is formed on the second end of the first conductive layer pattern 140. The first external terminal 150 is electrically connected to pads of a board on which the semiconductor package 100 is mounted. In this example embodiment, the board has a slot into which the semiconductor package 100 is inserted. Further, the pads are arranged around the slots. In this example embodiment, examples of the first external terminal 150 may include solder, gold, copper, etc and the first external terminal 150 may be a conductive bump.

The second insulation layer pattern 160 is formed on the first conductive layer pattern 140 and the first insulation layer pattern 130. In this example embodiment, to mount the first external terminal 150 on the pad of the board, the first external terminal 150 is exposed from the second insulation layer pattern 160. The second insulation layer pattern 160 has a third opening 162 in communication with the second opening 134. Accordingly, the second pad 114 is exposed through the second and third openings 134 and 162. The third opening 162 has a depth greater that that of the first opening 132. Here, the second insulation layer pattern 160 has a protrusion 164 positioned adjacent to the first external terminal 150. The protrusion 164 has a surface higher than that of the first external terminal 150. Further, to reduce an electromagnetic interference between the first external terminal 150 and the second external terminal 180, a ferrite material or a ferromagnetic material may be used as the second insulation layer pattern 160.

The second conductive layer pattern 170 is formed on the second insulation layer pattern 160. The second conductive layer pattern 170 is formed along the inner surface of the second and the third openings 134 and 162, and electrically connected to the second pad 114. In this example embodiment, the second conductive layer pattern 170 has a first end electrically connected to the second pad 114, and a second end elongated along the surface of the second insulation layer pattern 160 from the first end to the protrusion 164. In this example embodiment, an example of the second conductive layer pattern 170 may include a metal such as aluminum.

The second external terminal 180 is formed on the second end of the second conductive layer pattern 170. The second external terminal 180 may have a size substantially the same as that of the first external terminal 150. The second external terminal 180 is positioned above the protrusion 164 of the second insulation layer pattern 160. In some example embodiments, the second external terminal 180 is partially overlapped with the first external terminal 150. Thus, since the second external terminal 180 is located above the first external terminal 150, the first and the second external terminals 150 and 180 form a two-layered structure. Therefore, the first and the second external terminals 150 and 180 precisely make contact with the pads of the board without an electrical short between the first and the second external terminals 150 and 180. Alternatively, external terminals may have at least a three-layered structure using additional insulation layer patterns. In this example embodiment, examples of the second external terminal 180 may include solder, gold, copper, etc. and the second external terminal 180 may be a conductive bump.

FIGS. 2 to 14 are cross-sectional views illustrating a method of manufacturing the semiconductor package in FIG. 1.

Figure 2:
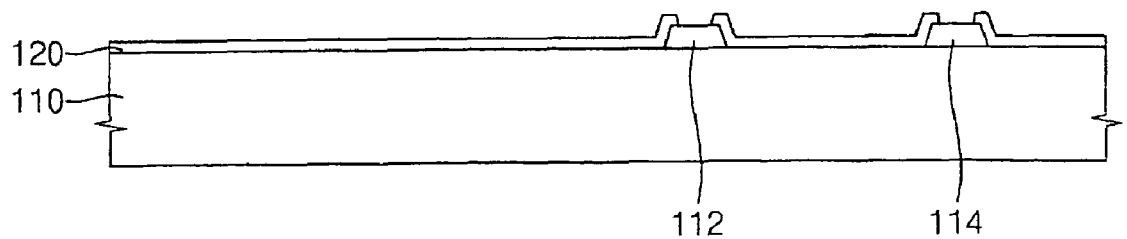
FIGS. 2 to 14 are cross-sectional views illustrating a method of manufacturing the semiconductor package in FIG. 1.

Referring to FIG. 2, the semiconductor chip 110 having the first pad 112 and the second pad 114 is prepared. The semiconductor chip 110 is among a plurality of semiconductor chips provided on a single wafer, with each of the plurality of semiconductor chips similar to the semiconductor chip 110 shown in FIG. 2. The passivation layer 120 is formed on the semiconductor chip 110 to expose the first and the second pads 112 and 114 through the passivation layer 120.

Figure 3:
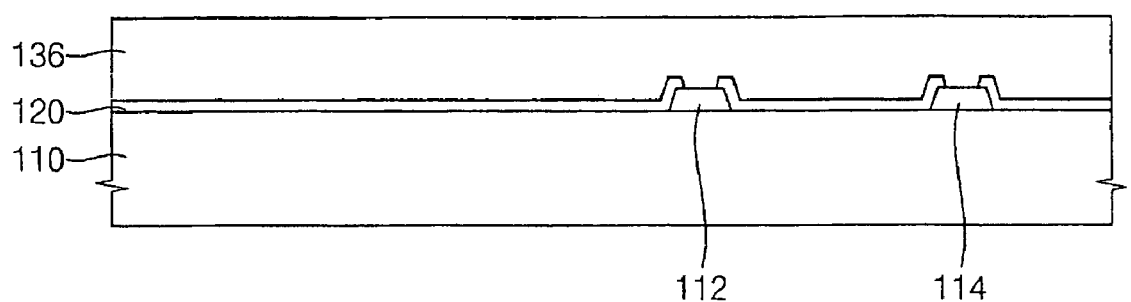

Referring to FIG. 3, a first insulation layer 136 is formed on the passivation layer 120. Examples of the first insulation layer 136 may include a silicon oxide layer, a silicon nitride layer, etc.

Figure 4:
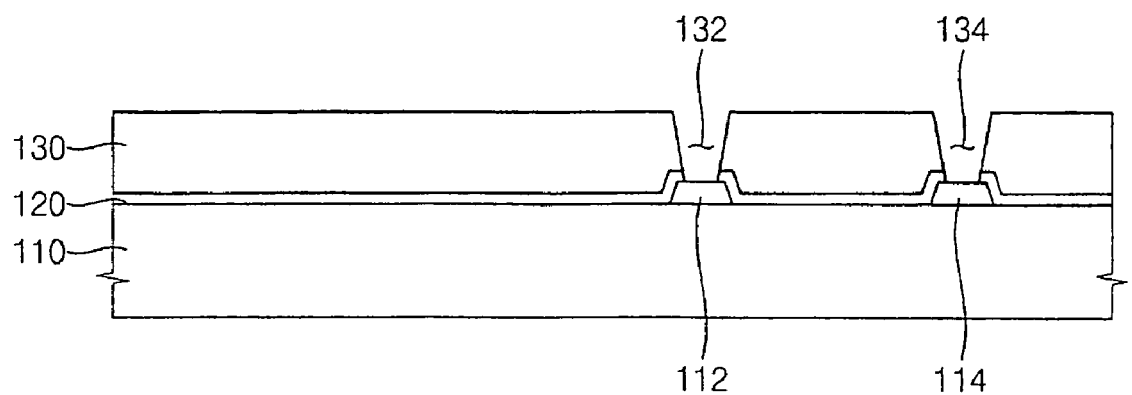

Referring to FIG. 4, the first insulation layer 136 is etched to form the first insulation layer pattern 130 having the first and second openings 132 and 134. In this example embodiment, a photoresist pattern (not shown) is formed on the first insulation layer 136. The first insulation layer 136 is etched using the photoresist pattern as an etching mask to form the first insulation layer pattern 130 having the first and the second openings 132 and 134. The first pad 112 is exposed through the first opening 132, and the second pad 114 is exposed through the second opening 134.

Figure 5:
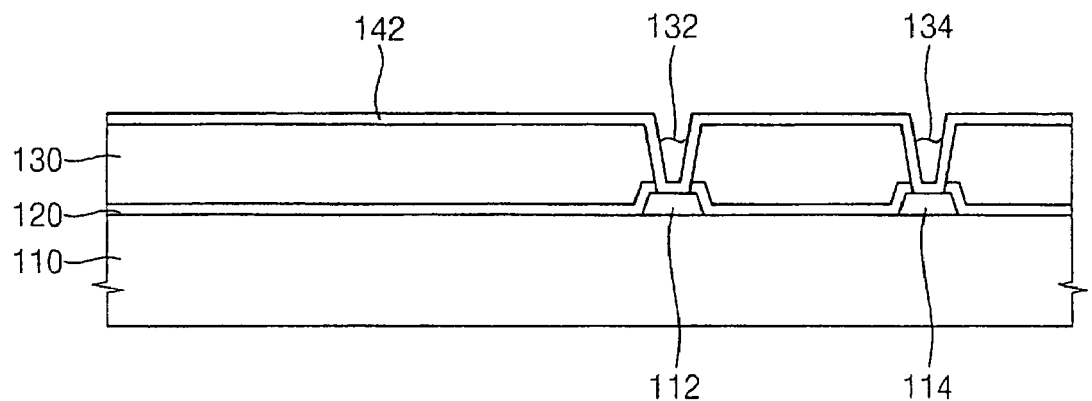

Referring to FIG. 5, a first conductive layer 142 is formed on the inner surfaces of the first insulation layer pattern 130 and the first and second openings 132 and 134. In this example embodiment, a metal such as aluminum may be used as the first conductive layer 142.

Figure 6:
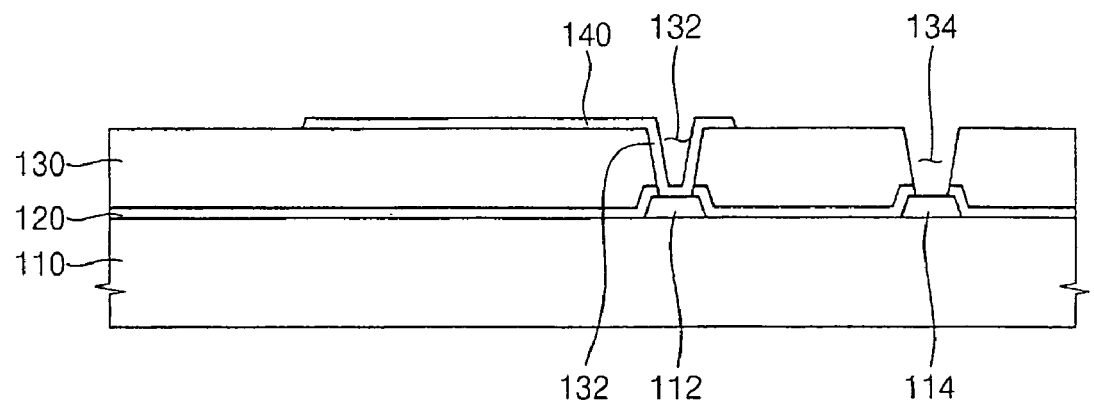

Referring to FIG. 6, the first conductive layer 142 is partially removed to form the first conductive layer pattern 140 elongated along the surface of the first insulation layer pattern 130 from the first pad 112. Here, the first conductive layer pattern 140 has the first end connected to the first pad 112 and the second end elongated along the surface of the first insulation layer pattern 130 from the first end.

Figure 7:
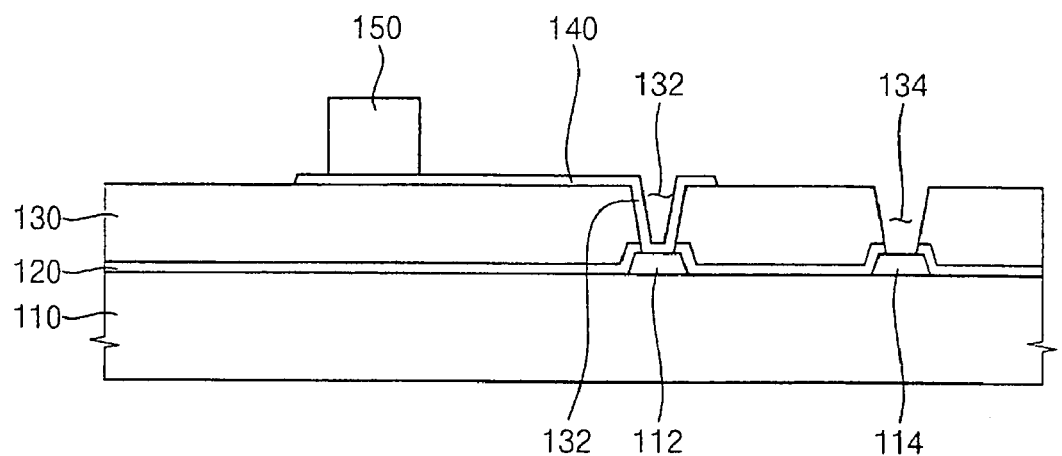

Referring to FIG. 7, the first external terminal 150 is formed on the second end of the first conductive layer pattern 140. Examples of the first external terminal 150 may include solder, gold, copper, etc and the first external terminal 150 may be a conductive bump. Additionally, a reflow process may be performed on the first external terminal 150 to provide the first external terminal 150 with a spherical shape.

Figure 8:
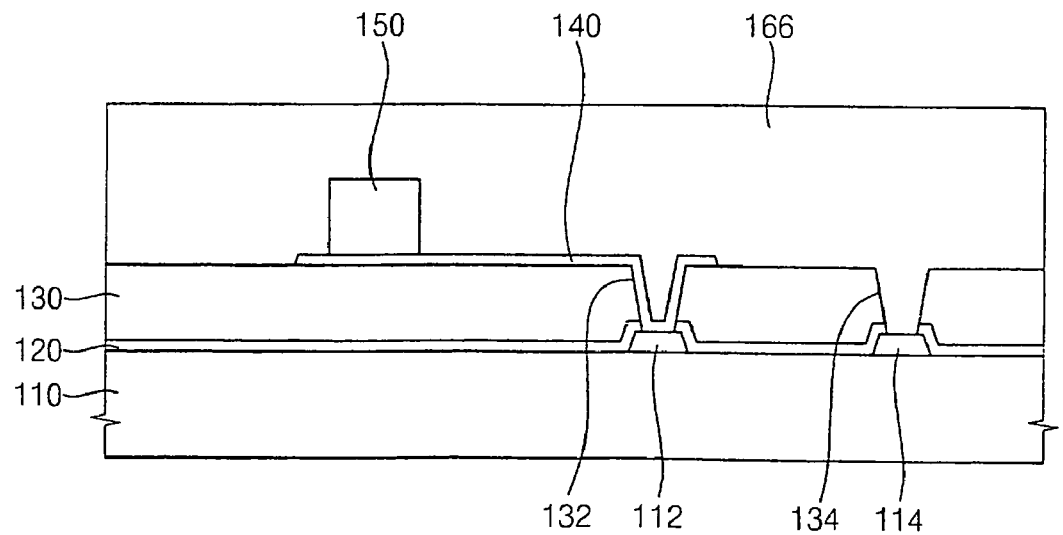

Referring to FIG. 8, a second insulation layer 166 is formed on the first insulation layer pattern 130 and the first conductive layer pattern 140 to cover the first external terminal 150. A ferrite material or a ferromagnetic material may be used as the second insulation layer 166.

Figure 9:
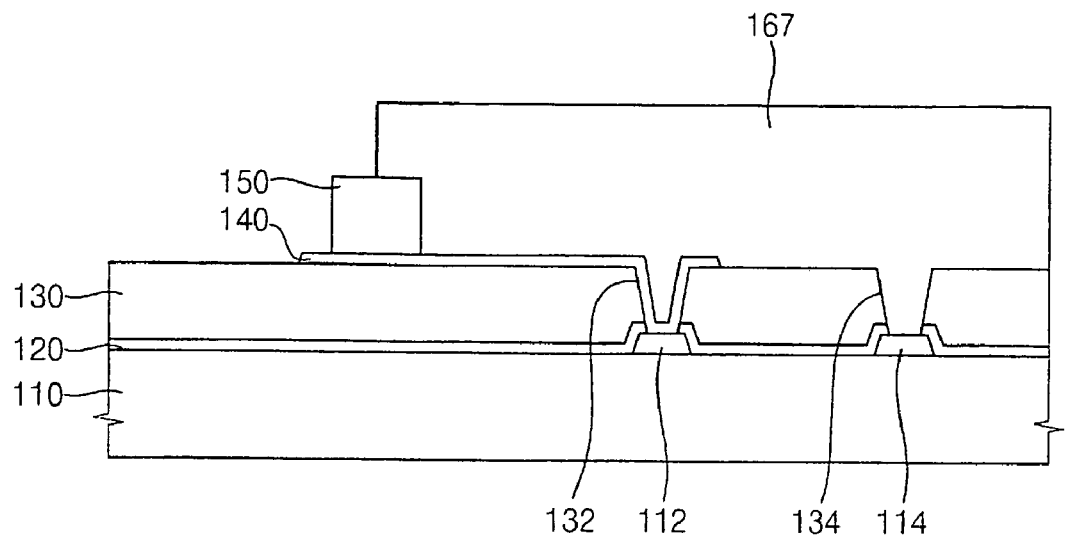

Referring to FIG. 9, the second insulation layer 166 is partially removed to form a second insulation structure 167 exposing at least a portion of the first external terminal 150.

Figure 10:
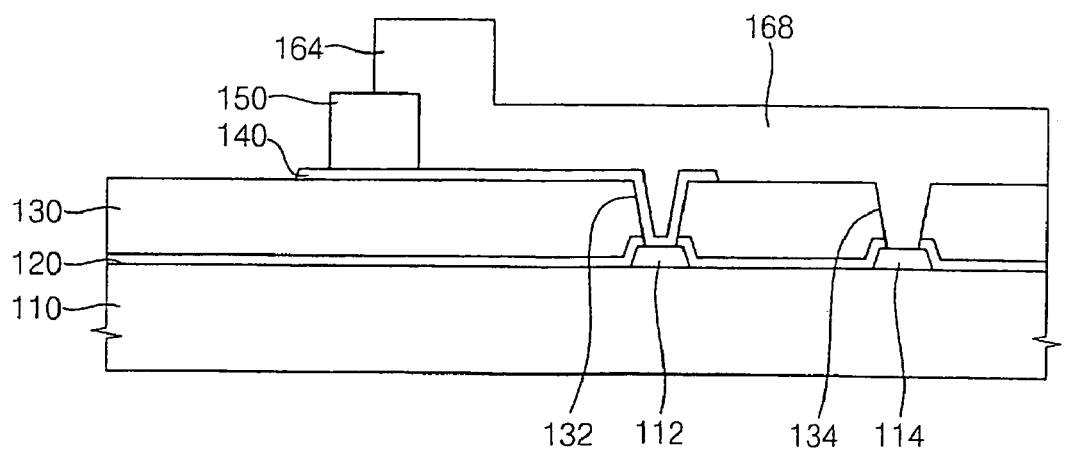

Referring to FIG. 10, a portion of the second insulation structure 167, except for a portion of the second insulation structure 167 adjacent to the first external terminal 150, is removed to form a second preliminary insulation layer pattern 168 having the protrusion 164 near the first external terminal 150.

Figure 11:
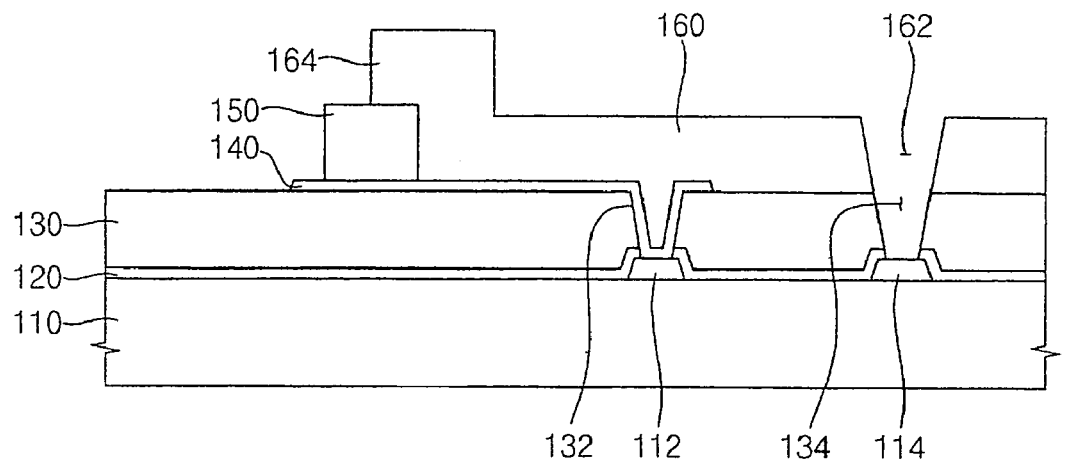

Referring to FIG. 11, the second preliminary insulation layer pattern 168 is etched to form the second insulation layer pattern 160 having the third opening 162 in communication with the second opening 134. Therefore, the second pad 114 of the semiconductor chip 110 is exposed through the second and the third openings 134 and 162.

Figure 12:
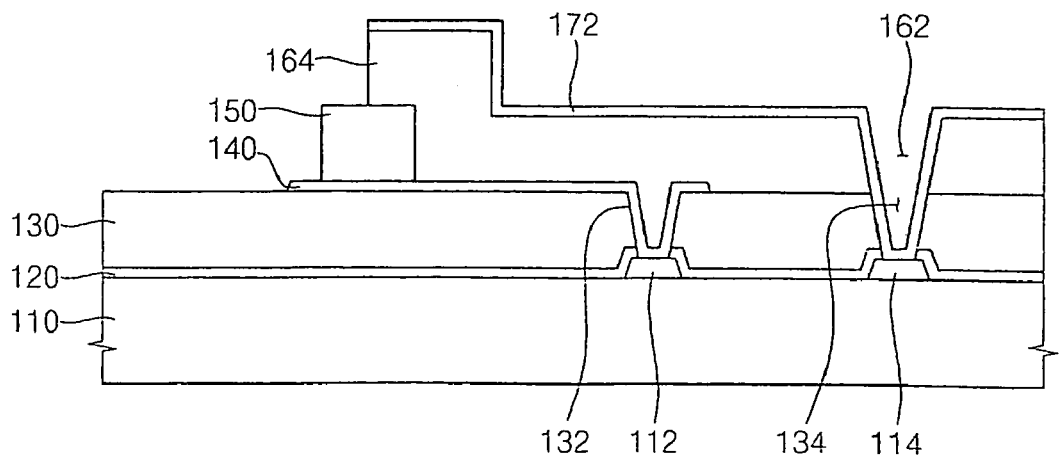

Referring to FIG. 12, a second conductive layer 172 is formed on the second insulation layer pattern 160 and the second and the third openings 134 and 162. In this example embodiment, a metal such as aluminum may be used as the second conductive layer 172.

Figure 13:
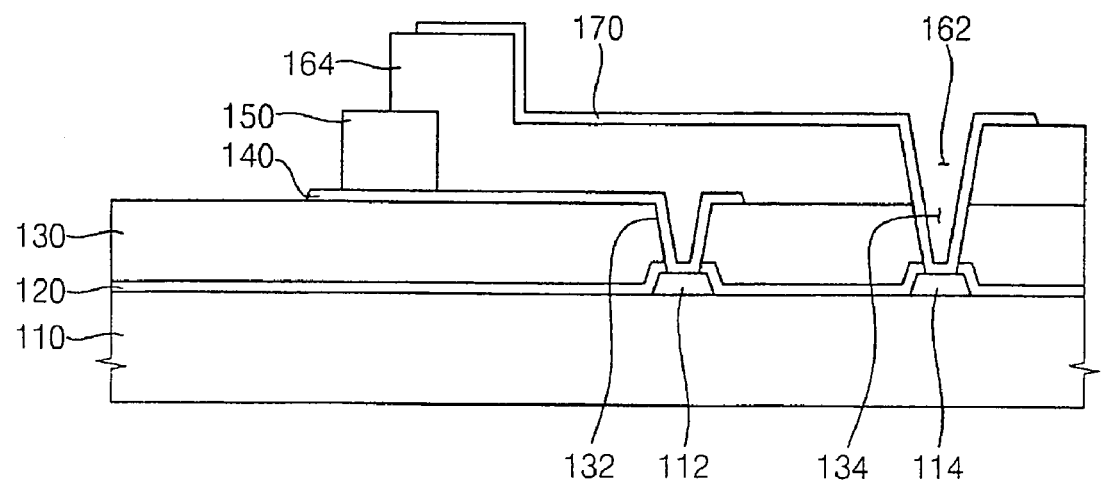

Referring to FIG. 13, the second conductive layer 172 is partially removed to form the second conductive layer pattern 170 that is elongated along the surface of the second insulation layer pattern 160 from the second pad 114 to the surface of the protrusion 164. In this example embodiment, the second conductive layer pattern 170 has the first end connected to the second pad 114 and the second end on the protrusion 164 elongated from the first end.

Figure 14:
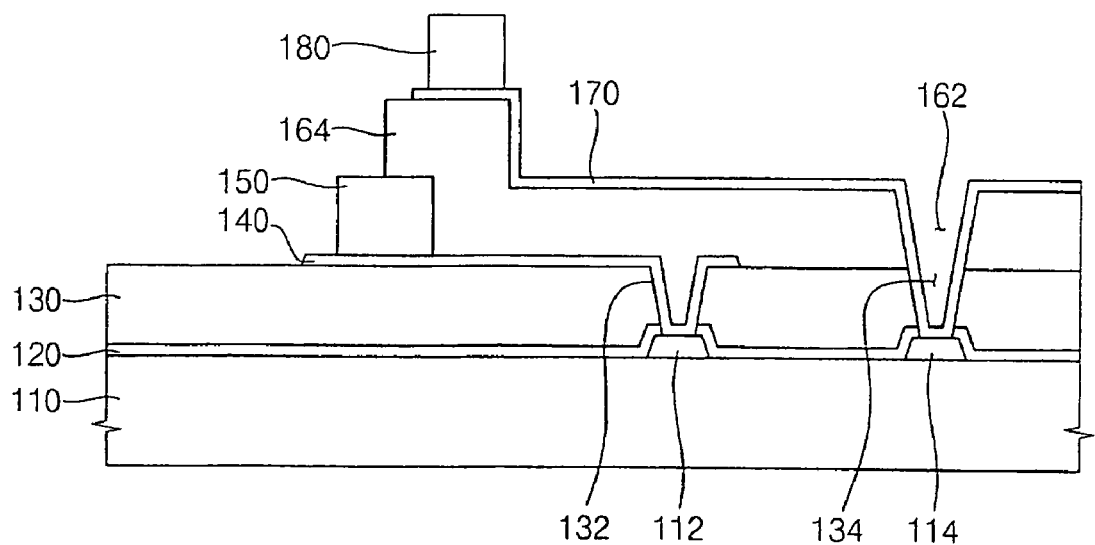

Referring to FIG. 14, a second external terminal 180 is formed on the second end of the second conductive layer pattern 170. The second external terminal 180 may have a size substantially the same as that of the first external terminal 150. Examples of the second external terminal 180 may include solder, gold, copper, etc and the second external terminal 180 may be a conductive bump. Additionally, a reflow process may be performed on the second external terminal 180 to provide the second external terminal 180 with a spherical shape.

Finally, the wafer is cut along scribe lanes to complete the semiconductor package 100 shown in FIG. 1. In this example embodiment, the semiconductor package 100 corresponds to a wafer-level package.

According to this example embodiment, as the first and the second external terminals have the two-layered structure, the first and the second external terminals may be mounted on the pads of a board without an electrical short between the first and the second external terminals.

Example Embodiment 2

Figure 15:
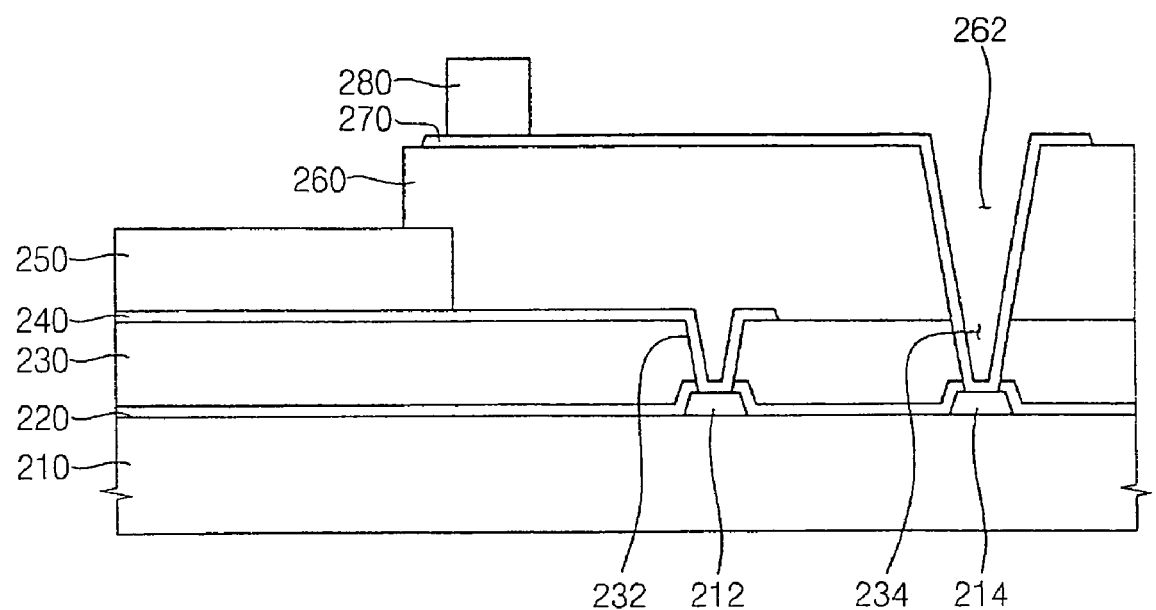
FIG. 15 is a cross-sectional view illustrating a semiconductor package in accordance with a second example embodiment of the present invention.

FIG. 15 is a cross-sectional view illustrating a semiconductor package in accordance with the second example embodiment of the present invention.

A semiconductor package 200 of this example embodiment includes elements substantially the same as those of the semiconductor package 100 in Embodiment 1 except for a ground terminal 250 and a second insulation layer pattern 260. Thus, any further illustrations with respect to the same elements are omitted herein for brevity.

Referring to FIG. 15, the semiconductor package 200 in accordance with this example embodiment includes a semiconductor chip 210, a first insulation layer pattern 230, a first conductive layer pattern 240, a ground terminal 250, a second insulation layer pattern 260, a second conductive layer pattern 270 and a signal terminal 280.

A first pad 212 of the semiconductor chip 210 is used for ground, and a second pad 214 is used for signal. Therefore, the ground terminal 250 electrically connected to the first pad 212 is used for ground. As the ground terminal 250 connected to the first pad 212 is used for ground, the ground terminal 250 has a width relatively wider than that of the signal terminal 280 for rapidly transmitting an electric current.

Further, the second insulation layer pattern 260 does not have a protrusion unlike the second insulation layer pattern 160 in Embodiment 1. Therefore, the signal terminal 280 connected to the second pad is formed on the second conductive layer pattern 270 on the second insulation layer pattern 260.

Here, a method of manufacturing the semiconductor package 200 in accordance with this example embodiment is substantially the same as that explained in Embodiment 1. Therefore, any further illustrations with respect to the method are omitted herein for brevity.

According to example embodiments of the present invention, since the terminals have a stacked structure, a pitch between the terminals may be narrowed without an electrical short between the terminals. As a result, the semiconductor package having the terminals may have a small size.

Further, the pads of the board connected to the terminals may be alternately arranged around the slot of the board, so that the board may have a small size.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of this invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor package, comprising:
    forming a first insulation layer pattern defining first and second openings that expose first and second pads of a semiconductor device, respectively, on the semiconductor device having the first and second pads;
    forming a first conductive layer pattern on the first insulation layer pattern and the first pad;
    forming a first external terminal on the first conductive layer pattern;
    forming a second insulation layer pattern defining a third opening in communication with the second opening on the first conductive layer pattern and the first insulation layer pattern, the second insulation layer pattern exposing a portion of the first external terminal;
    forming a second conductive layer pattern on the second insulation layer pattern and the second pad; and
    forming a second external terminal on the second conductive layer pattern,
    wherein forming the second insulation layer pattern includes:
        forming a second insulation layer on the first conductive layer pattern and the first insulation layer pattern so as to cover the first external terminal;
        partially removing the second insulation layer to form a second insulation structure having a protrusion higher than the first external terminal; and
        etching the second insulation structure to form the second insulation layer pattern defining the third opening.

2. The method of claim 1, wherein forming the first insulation layer pattern comprises:
    forming a first insulation layer on the semiconductor substrate; and
    etching the first insulation layer to form the first insulation layer pattern defining the first and the second openings.

3. The method of claim 2, wherein the first insulation layer comprises a ferrite material or a ferromagnetic material.

4. The method of claim 1, wherein forming the first conductive layer pattern comprises:
    forming a first conductive layer on the first insulation layer pattern and the first opening; and
    etching the first conductive layer to form the first conductive layer pattern.

5. The method of claim 4, wherein the first conductive layer comprises aluminum.

6. The method of claim 1, wherein the second insulation layer comprises a ferrite material or a ferromagnetic material.

7. The method of claim 1, wherein forming the second conductive layer pattern comprises:
    forming a second conductive layer on the second insulation layer pattern, the second opening, and the third opening; and
    etching the second conductive layer to form the second conductive layer pattern.

8. The method of claim 7, wherein the second conductive layer comprises aluminum.

9. The method of claim 1, wherein the first and the second external terminals comprise solder, gold or copper.

10. The method of claim 1, wherein the second insulation layer pattern has a protrusion higher than a top surface of the first external terminal, and the second external terminal is disposed on the protrusion.

11. The method of claim 1, wherein a bottom surface of the second external terminal is disposed higher above the semiconductor device than a bottom surface of the first external terminal.

12. The method of claim 1, wherein the second external terminal overlaps at least a portion of the first external terminal in a direction substantially orthogonal to the semiconductor device.

13. A method of manufacturing a semiconductor package, comprising:
    forming a first insulation layer pattern defining first and second openings that expose first and second pads of a semiconductor device, respectively, on the semiconductor device having the first and second pads;
    forming a first conductive layer pattern on the first insulation layer pattern and the first pad;
    forming a first external terminal on the first conductive layer pattern;
    forming a second insulation layer pattern defining a third opening in communication with the second opening on the first conductive layer pattern and the first insulation layer pattern, the second insulation layer pattern exposing a portion of the first external terminal;
    forming a second conductive layer pattern on the second insulation layer pattern and the second pad; and
    forming a second external terminal on the second conductive layer pattern,
    wherein the second external terminal overlaps at least a portion of the first external terminal in a direction substantially orthogonal to the semiconductor device.

* * * * *